(12) United States Patent
Kataoka et al.

(10) Patent No.: US 10,091,881 B1
(45) Date of Patent: Oct. 2, 2018

(54) CONNECTION STRUCTURE BETWEEN OPTICAL DEVICE AND CIRCUIT SUBSTRATE, AND OPTICAL TRANSMISSION APPARATUS USING THE SAME

(71) Applicant: Sumitomo Osaka Cement Co., Ltd, Tokyo (JP)

(72) Inventors: Toshio Kataoka, Tokyo (JP); Kei Katou, Tokyo (JP)

(73) Assignee: SUMITOMO OSAKA CEMENT CO., LTD., Chiyoda-Ku, Tokyo (JP)

(*) Notice: Subject to any disclaimer, the term of this patent is extended or adjusted under 35 U.S.C. 154(b) by 0 days.

(21) Appl. No.: 15/924,378

(22) Filed: Mar. 19, 2018

(30) Foreign Application Priority Data

Mar. 30, 2017 (JP) .................. 2017-067208

(51) Int. Cl.
*H05K 1/14* (2006.01)
*H05K 1/02* (2006.01)
*H01R 12/62* (2011.01)
*H01R 12/69* (2011.01)
*H05K 1/11* (2006.01)
(Continued)

(52) U.S. Cl.
CPC ............ *H05K 1/147* (2013.01); *H01R 12/62* (2013.01); *H01R 12/69* (2013.01); *H05K 1/0219* (2013.01); *H05K 1/113* (2013.01); *H05K 1/118* (2013.01); *G02F 1/2255* (2013.01); *G02F 2001/212* (2013.01); *H05K 1/0225* (2013.01); *H05K 2201/0969* (2013.01); *H05K 2201/09181* (2013.01); *H05K 2201/09354* (2013.01); *H05K 2201/09727* (2013.01); *H05K 2201/09736* (2013.01); *H05K 2201/10121* (2013.01); *H05K 2201/10303* (2013.01)

(58) Field of Classification Search
CPC ......... H05K 1/147; H05K 2201/10121; H05K 2201/09181; H05K 2201/09354; H05K 2201/10303; H05K 1/0225; H05K 1/118; H05K 1/0219; H01R 12/69
USPC .......................................... 174/254; 361/749
See application file for complete search history.

(56) References Cited

U.S. PATENT DOCUMENTS 9,285,650 B2  3/2016 Sugiyama et al.
9,436,018 B2  9/2016 Sugiyama
(Continued)

FOREIGN PATENT DOCUMENTS

JP  2014089400 A  5/2014
JP  2015170729 A  9/2015

*Primary Examiner* — Sherman Ng
(74) *Attorney, Agent, or Firm* — Taft Stettinius & Hollister LLP (57) ABSTRACT

An optical device includes a connection pad, which is connected to a conductor pattern on the circuit substrate, at one edge. The connection pad includes one ground pad, and two or more signal pads between which the ground pad is interposed from its both sides. The ground pad includes a concave portion including an opening at the edge. The circuit substrate is provided with a metal columnar member in the conductor pattern to which the ground pad is connected. The conductor pattern and the connection pad are fixed to each other with solder in a state in which the columnar member is fitted into the concave portion. Solder, which gradually rises from the ground pattern to a lateral surface of the columnar member, is formed between the columnar member and the ground pattern that is formed in the flexible printed circuit.

6 Claims, 11 Drawing Sheets

(51) Int. Cl.
    *G02F 1/21*          (2006.01)
    *G02F 1/225*       (2006.01)

(56) References Cited

U.S. PATENT DOCUMENTS

| | | | |
|---|---|---|---|
| 2011/0188816 A1* | 8/2011 | Uemura | H01R 9/00 |
| | | | 385/88 |
| 2012/0051683 A1* | 3/2012 | Sugiyama | G02F 1/0327 |
| | | | 385/1 |
| 2015/0253592 A1* | 9/2015 | Sugiyama | G02F 1/0121 |
| | | | 385/40 |
| 2015/0253593 A1* | 9/2015 | Sugiyama | G02F 1/0121 |
| | | | 385/40 |
| 2016/0246156 A1* | 8/2016 | Sugiyama | G02F 1/2255 |
| 2017/0336584 A1* | 11/2017 | Ariga | H05K 1/02 |

\* cited by examiner

VIEW SEEN FROM X-X CROSS-SECTIONAL ARROW DIRECTION

FIG. 11

CONNECTION STRUCTURE BETWEEN OPTICAL DEVICE AND CIRCUIT SUBSTRATE, AND OPTICAL TRANSMISSION APPARATUS USING THE SAME

CROSS-REFERENCE TO RELATED APPLICATIONS

This application claims the benefit of Japanese Patent Application No. 2017-067208 filed Mar. 30, 2017, the disclosure of which is herein incorporated by reference in its entirety.

BACKGROUND OF THE INVENTION

Field of the Invention

The present invention relates to a connection structure between an optical device such as an optical modulator and a circuit substrate on which an electronic circuit configured to drive the optical device is mounted, and an optical transmission apparatus using the connection structure, and more particularly, to a connection structure between the optical device and the circuit substrate through a flexible printed circuit of the optical device, and an optical transmission apparatus using the connection structure.

Description of Related Art

In high-frequency/large-capacity optical fiber communication systems, optical modulators embedded with waveguide-type optical modulation element are frequently used. Among these, optical modulation elements in which $LiNbO_3$ (hereinafter, also referred to as "LN") having an electro-optic effect is used for substrates cause only a small optical loss and are capable of realizing broad band optical modulation characteristics and thus are widely used for high-frequency/large-capacity optical fiber communication systems.

The optical modulation element using an LN substrate is provided with a Mach-Zehnder optical waveguide, and an electrode (RF electrode) configured to apply a radio-frequency signal that is a modulation signal to the optical waveguide. The electrode is connected to a circuit substrate (hereinafter, abbreviated as a circuit substrate), on which an electronic circuit that allows the optical modulator to operate a modulation operation is mounted, via lead pins or a connector that is provided in a housing of the optical modulator in which the optical modulation element is housed.

With regard to a modulation form in the optical fiber communication systems, a transmission format such as quadrature phase shift keying (QPSK) and dual polarization-quadrature phase shift keying (DP-QPSK), which use multi-level modulation or in which polarization multiplexing is introduced to the multi-level modulation, becomes a main stream in pursuit of a recent increase in transmission capacity. The transmission format is used in a basic optical transmission network, and is also introduced to a metro network.

An optical modulator (QPSK optical modulator) that performs QPSK modulation or an optical modulator (DP-QPSK optical modulator) that performs DP-QPSK modulation includes a plurality of Mach-Zehnder optical waveguides having a box structure, and a plurality of RF electrodes (for example, refer to Patent Literature 1).

Accordingly, the size of the housing of the optical modulator tends to increase. According to this, particularly, there is a strong demand for miniaturization.

As one countermeasure for coping with the demand for miniaturization, in the related art, there is suggested an optical modulator in which a push-on type coaxial connector provided in a housing of the optical modulator as an interface of the RF electrodes is substituted with lead pins similar to an interface of bias electrodes, and a flexible printed circuit (FPC) configured to electrically connect the lead pins and an external circuit substrate to each other is provided.

For example, in the DP-QPSK optical modulator, an optical modulation element including four Mach-Zehnder optical waveguides each including an RF electrode is used. In this case, in a case where four push-on type coaxial connectors are provided in the housing of the optical modulator, it is difficult to avoid an increase in size of the housing, but when using the lead pins and the FPC instead of the coaxial connectors, it is possible to realize miniaturization.

In addition, the lead pins of the housing of the optical modulator, and a circuit substrate on which an electronic circuit configured to allow the optical modulator to perform a modulation operation is mounted are connected to each other through the FPC. Accordingly, it is not necessary to perform coaxial cable excess-length processing that is used in the related art, and thus it is possible to reduce a mounting space of the optical modulator in the optical transmission apparatus.

For example, the FPC that is used in the optical modulator is prepared by using a flexible polyimide-based material as a substrate (hereinafter, referred to as "FPC substrate"), and each of a plurality of through-holes provided in the vicinity of one end is electrically connected to each of pads provided on the other end through a wiring pattern. In addition, a plurality of lead pins, which protrude from a bottom surface or a lateral surface of the housing of the optical modulator, are respectively inserted into the plurality of through-holes, and are fixed and electrically connected to the plurality of through-holes, for example, by using solder. The plurality of pads are fixed and connected to the circuit substrate, for example, by using solder. According to this, a radio-frequency signal, which is applied from the pads on the circuit substrate, is applied to a corresponding RF electrode of the optical modulation element through corresponding through-hole and lead pin, and thus high-frequency optical modulation is performed.

In the optical modulator using the FPC, as described above, it is possible to miniaturize the housing, and it is also possible to reduce a mounting space of the optical modulator on the circuit substrate, and thus it is possible to greatly contribute to miniaturization of the optical transmission apparatus.

Figure 7A:
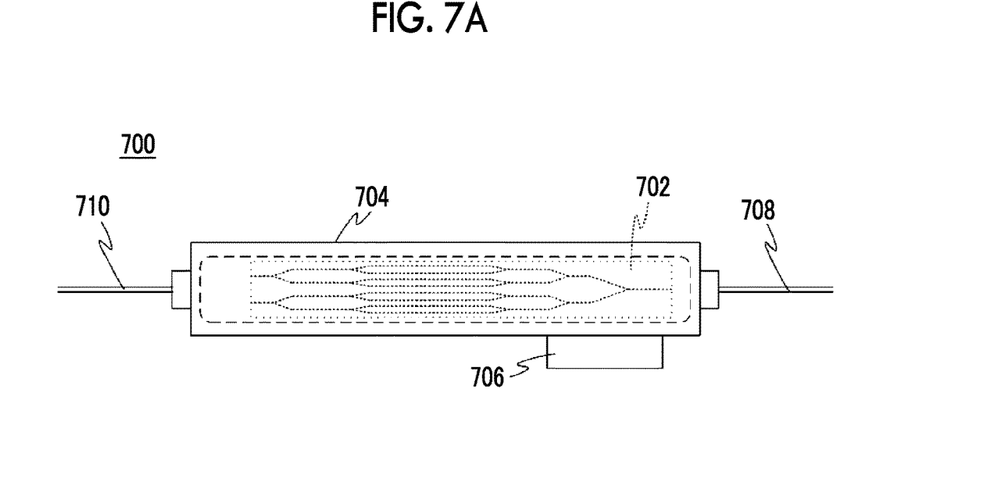
FIG. 7A is a view illustrating a configuration of an optical modulator in the related art.
Figure 7B:
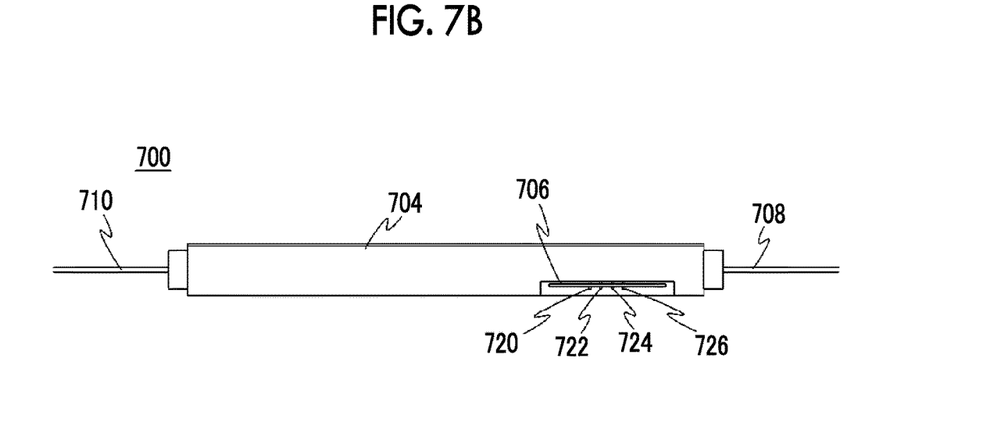
FIG. 7B is a view illustrating the configuration of the optical modulator in the related art.
Figure 7C:
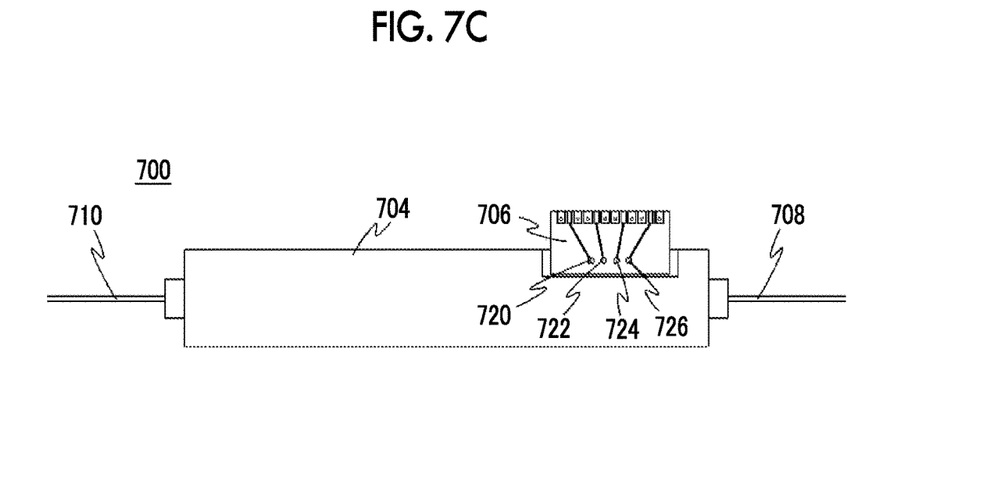
FIG. 7C is a view illustrating the configuration of the optical modulator in the related art.

FIG. 7A, FIG. 7B, and FIG. 7C are views illustrating a configuration of a DP-QPSK optical modulator with the FPC in the related art. FIG. 7A is a top view of the DP-QPSK optical modulator, FIG. 7B is a front view thereof, and FIG. 7C is a bottom view thereof. A DP-QPSK optical modulator 700 includes an optical modulation element 702, a housing 704 that houses the optical modulation element 702, a flexible printed circuit (FPC) 706, an optical fiber 710 through which a light beam is input to the optical modulation element 702, an optical fiber 708 that guides the light beam output from the optical modulation element 702 to the outside of the housing 704.

The housing 704 is provided with four lead pins 720, 722, 724, and 726 which are respectively connected to four RF electrodes (not illustrated) of the optical modulation element 702, and the lead pins 720, 722, 724, and 726 are inserted into the following through-holes 820, 822, 824, and 826 which are provided in the FPC 706, and are fixed and electrically connected, for example, with solder.

Figure 8A:
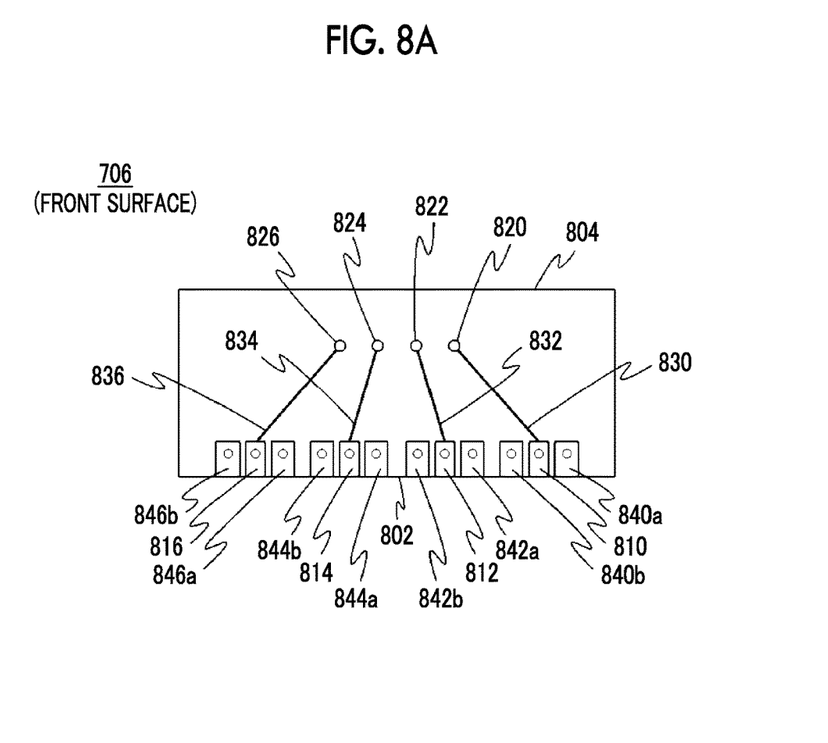
FIG. 8A is a view illustrating a configuration of a front surface of a flexible printed circuit that is provided in the optical modulator illustrated in FIGS. 7A, 7B, and 7C in the related art.
Figure 8B:
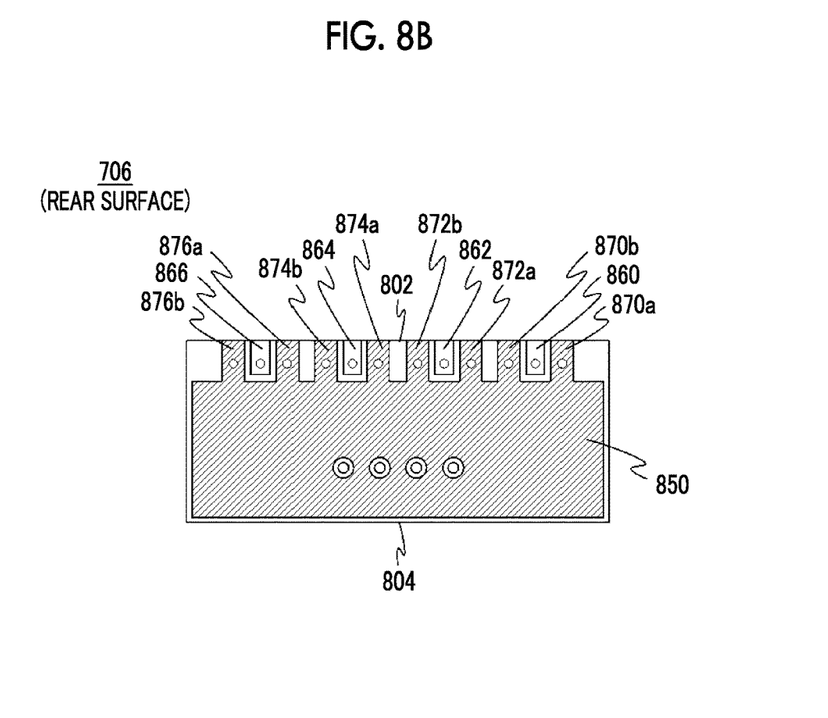
FIG. 8B is a view illustrating a configuration of a rear surface of the flexible printed circuit that is provided in the optical modulator illustrated in FIGS. 7A, 7B, and 7C in the related art.

FIG. 8 is a view illustrating a configuration of the FPC 706. FIG. 8A and FIG. 8B illustrate two opposite surfaces of the FPC 706. Here, it is assumed that a surface illustrated in FIG. 8A is a front surface, and a surface illustrated in FIG. 8B is a rear surface. The surface illustrated in FIG. 8A corresponds to a surface of the FPC 706 illustrated in FIG. 7C.

In the vicinity of one side 802 on a lower side on the front surface of the FPC 706 illustrated in FIG. 8A, four pads for signal (signal pads) 810, 812, 814, and 816 are provided in parallel along a direction of the one side 802. In addition, on another side 804 side that is opposite to the side 802, for example, four through-holes 820, 822, 824, and 826 are provided in parallel, for example, along a direction of the side 804. In addition, the four signal pads 810, 812, 814, and 816 are electrically connected to the through-holes 820, 822, 824, and 826 by wiring patterns 830, 832, 834, and 836, respectively.

In addition, on the front surface of the FPC 706, pads for ground (ground pads) 840a and 840b, 842a and 842b, 844a and 844b, and 846a and 846b are provided in parallel at positions at which each of the signal pads 810, 812, 814, and 816 is interposed between each pair of the ground pads from both sides along a direction of the side 802. The ground pads 840a, 840b, 842a, 842b, 844a, 844b, 846a, and 846b are respectively connected to ground patterns 870a, 870b, 872a, 872b, 874a, 874b, 876a, and 876b (to be described later) on the rear surface through via-holes.

On the other hand, a ground plane 850 is formed on the rear surface of the FPC 706 illustrated in FIG. 8B, and the wiring patterns 830, 832, 834, and 836 on the front surface constitute a grounded coplanar waveguide (GCPW) in combination with the ground plane 850 on the rear surface. In addition, the ground plane 850 includes the ground patterns 870a, 870b, 872a, 872b, 874a, 874b, 876a, and 876b which extend to positions corresponding to the ground pads 840a, 840b, 842a, 842b, 844a, 844b, 846a, and 846b on the front surface.

In addition, on the rear surface of the FPC 706, signal pads 860, 862, 864, and 866 are provided at positions corresponding to the signal pads 810, 812, 814, and 816 on the front surface in the same size as that of the signal pads 810, 812, 814, and 816. The signal pads 860, 862, 864, and 866 and the signal pads signal pads 810, 812, 814, and 816 are electrically connected to each other through via-holes.

In addition, when mounting the optical modulator 700 in the optical transmission apparatus, the signal pads 810, 812, 814, and 816 and the ground pads 840a, 840b, 842a, 842b, 844a, 844b, 846a, and 846b are fixed and electrically connected to corresponding pads provided in a circuit substrate at the inside of the optical transmission apparatus, for example, with solder. According to this, the RF electrode of the optical modulation element 702 housed in the optical modulator 700, and signal lines of an electronic circuit provided on the circuit substrate are electrically connected to each other.

Figure 9:
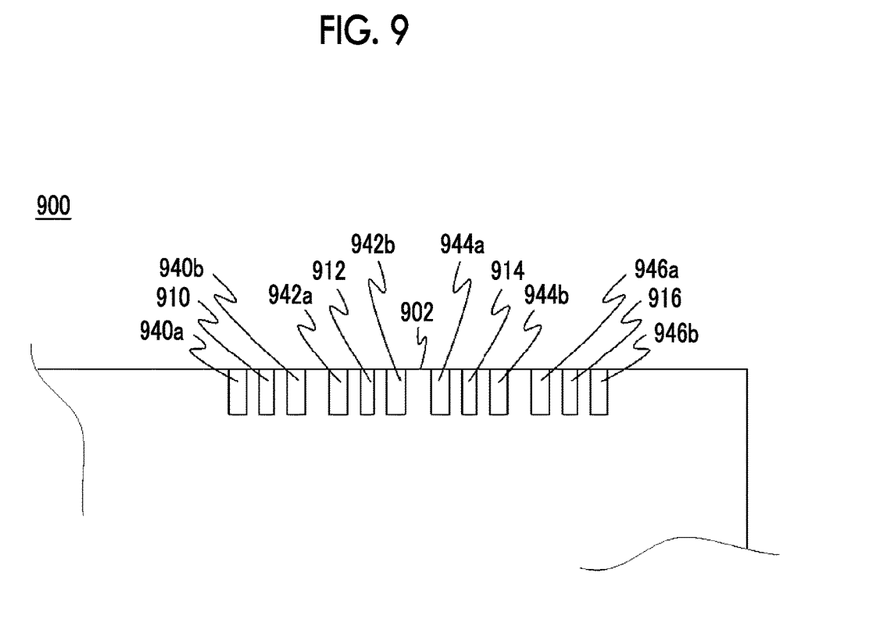
FIG. 9 is a partial detail view of a circuit substrate in the related art to which the flexible printed circuit provided in the optical modulator illustrated in FIGS. 7A, 7B, and 7C in the related art is connected.

FIG. 9 is a view illustrating a configuration of a circuit substrate 900 that is an example of the circuit substrate that is used in the optical transmission apparatus as described above. Circuit signal pads 910, 912, 914, and 916, and circuit ground pads 940a, 940b, 942a, 942b, 944a, 944b, 946a, and 946b, to which the signal pads 810, 812, 814, and 816, and the ground pads 840a, 840b, 842a, 842b, 844a, 844b, 846a, and 846b on the front surface of the FPC 706 are respectively connected, are provided in parallel on one side 902 of the circuit substrate 900.

The circuit signal pads 910, 912, 914, and 916, and the circuit ground pads 940a, 940b, 942a, 942b, 944a, 944b, 946a, and 946b are provided at positions corresponding to the signal pads 810, 812, 814, and 816, and the ground pads 840a, 840b, 842a, 842b, 844a, 844b, 846a, and 846b, which are disposed on the pads, of the FPC 706. In addition, it is not necessary for the circuit signal pad 910 and the like, and the circuit ground pad 940a and the like to have the same size as that of the signal pad 810 and the like and the ground pad 840a and the like of the FPC 706. For example, the width of the circuit signal pad 910 and the like and the circuit ground pad 940a and the like may be configured to be narrower or wider than the width of the signal pad 810 and the like and the ground pad 840a and the like from the viewpoint of impedance matching between signal lines when the circuit substrate 900 and the FPC 706 are connected to each other.

Furthermore, FIG. 9 illustrates only a portion in which the circuit signal pads 910, 912, 914, and 916 and the circuit ground pads 940a, 940b, 942a, 942b, 944a, 944b, 946a, and 946b are formed and a peripheral portion thereof in the circuit substrate 900 for easy understanding while avoiding redundant description. In addition, various patterns, which constitute an electronic circuit, maybe provided on the circuit substrate 900. However, for the same reason, FIG. 9 illustrates only the circuit signal pads 910, 912, 914, and 916, and the circuit ground pads 940a, 940b, 942a, 942b, 944a, 944b, 946a, and 946b to which the signal pads 810, 812, 814, and 816, and the ground pads 840a, 840b, 842a, 842b, 844a, 844b, 846a, and 846b of the FPC 706 are respectively connected, and description of the other patterns, which are led to the circuit signal pads and the circuit ground pads, on the circuit substrate 900 is omitted.

Figure 10A:
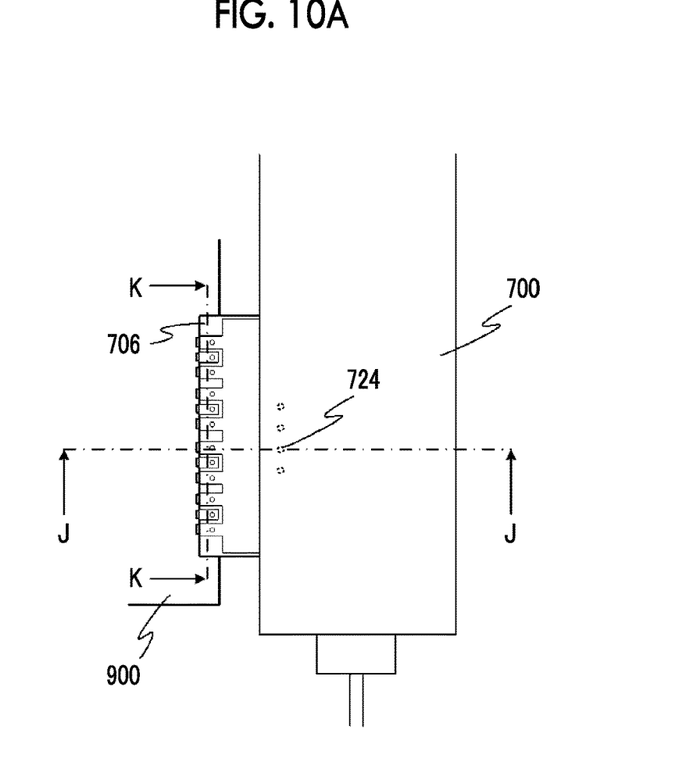
FIG. 10A is a view illustrating a connection structure between the optical modulator and the circuit substrate in the related art.
Figure 10B:
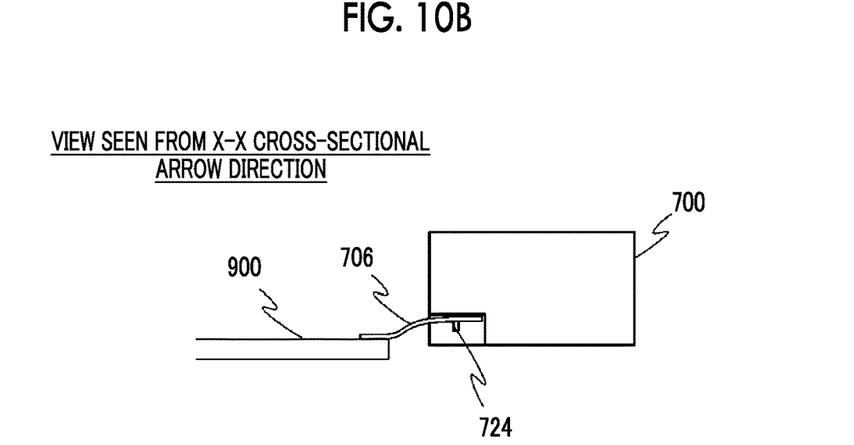
FIG. 10B is a view illustrating the connection structure between the optical modulator and the circuit substrate in the related art as illustrated in FIG. 10A when seen from an X-X cross-sectional arrow direction.
Figure 11:
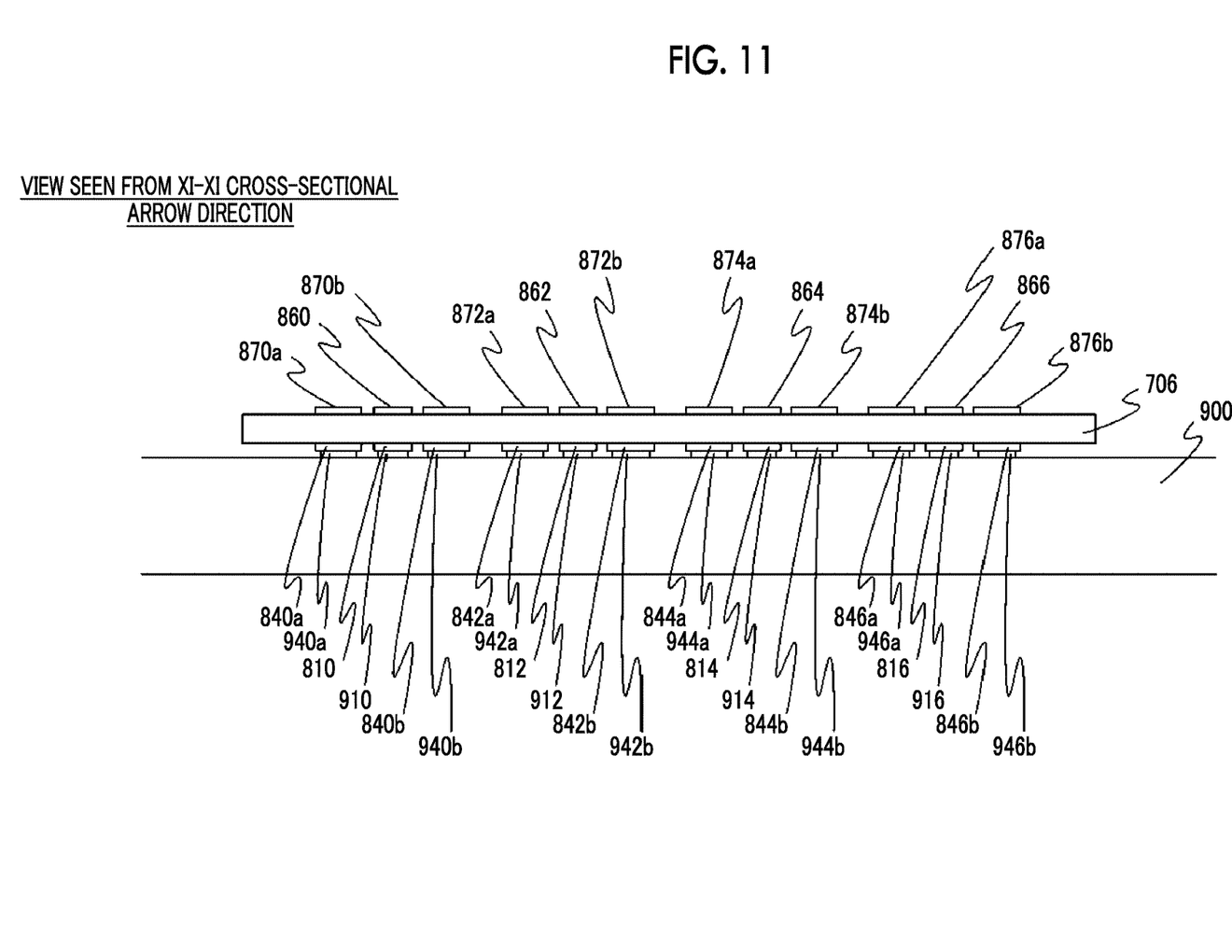
FIG. 11 is a view illustrating the connection structure between the optical modulator and the circuit substrate in the related art as illustrated in FIG. 10A when seen from a XI-XI cross-sectional arrow direction.

FIGS. 10A and 10B are views illustrating an example of a connection structure between the optical modulator 700 and the circuit substrate 900 in the related art. FIG. 10A is a view when seen from an upper surface direction of the optical modulator 700, and FIG. 10B is a view when seen from an X-X cross-sectional arrow direction in FIG. 10A. In addition, FIG. 11 is a view when seen from a XI-XI cross-sectional arrow direction in FIG. 10A.

As illustrated in FIG. 10A, the FPC 706 of the optical modulator 700 extends to a left side in the drawing, and as illustrated in FIG. 10B, a left end is bent in an oblique lower-left direction in the drawing to come into contact with the circuit substrate 900. According to this, as illustrated in FIG. 11, the signal pads 810, 812, 814, and 816, and the ground pads 840a, 840b, 842a, 842b, 844a, 844b, 846a, and 846b of the FPC 706 are respectively pressed to the circuit signal pads 910, 912, 914, and 916, and the circuit ground pads 940a, 940b, 942a, 942b, 944a, 944b, 946a, and 946b, and are fixed and electrically connected, for example, with solder.

In addition, typically, connection between corresponding pads in the optical modulator 700 and the circuit substrate 900 is performed through manual work by using a soldering iron and the like in a state in which the FPC 706 is simply pressed to a substrate surface of the circuit substrate 900 to be maintained. According to this, in the connection structure illustrated in FIGS. 10A, 10B, and 11 in the related art, a relative position of the FPC 706 with respect to the circuit substrate 900 is likely to deviate in connection work.

As described above, a modulation operation required for the optical modulator is performed at a higher frequency and a broader bandwidth in accordance with an increase in optical transmission capacity required for the optical fiber communication system, and in a case of performing a complicate modulation operation as in the DP-QPSK as means for realizing the modulation operation and the like, the number of signal lines which are input to the optical modulator, that is, the number of pads provided in the FPC increases. In contrast, a demand for miniaturization in size of the optical modulator is not changed, and thus the size of the pads to be formed on the FPC is reduced in accordance with the increase in the number of necessary electrodes as described above. As one example, in a typical DP-QPSK optical modulator, for example, the number of signal electrodes is four. In addition, with regard to the size of the pads formed on the FPC, the width thereof is several hundreds of micrometers, and the length thereof is approximately 1.5 mm.

More specifically, for example, in The optical internetworking forum (OIF) that is a business organization in an optical communication field, as an FPC that is provided in an optical modulator that performs orthogonal phase modulation of polarization multiplexing, it is recommended that an interval between adjacent signal pads is set to approximately 4 mm, the width of the signal pads (length in a direction of the side 802 in FIG. 8A) is set to approximately 350±50 μm, and the width of the circuit signal pads of the circuit substrate is set to approximately 400 μm (OIF-PMQ-TX-01.2 as materials published by OIF). In addition, in the signal pads and the circuit signal pads which have the above-described width, the amount of deviation of the central lines when connecting the signal pads and the circuit signal pads to each other is recommended to be 100 μm or less.

However, in the connection structure of the related art, relative positioning of the FPC 706 with respect to the circuit substrate 900 is performed by simply pressing the FPC 706 to the circuit substrate 900 as described above. Therefore, it may be difficult to realize the amount of positional deviation between the signal pads and the circuit signal pads in a predetermined permissible range of the order of 0.1 mm with satisfactory accuracy and satisfactory reproducibility.

In addition, in a case where the interval between the adjacent signal pads is set to an interval of the order of mm as in the above-described OIF recommendation, an influence by cross-talk between the adjacent signal pads on a modulation operation is not negligible. In addition, in a case where the number of radio-frequency signals to be input to the optical modulator increases in correspondence with an increase in the transmission capacity in the future, the interval between the adjacent signal pads gradually decreases, and thus the influence by the cross-talk may be a significant problem on securement of optical transmission quality.

SUMMARY OF THE INVENTION

From the background, in a connection structure between an optical device such as an optical modulator that operates by using radio-frequency signals, and a circuit substrate, it is required to effectively reduce cross-talk between adjacent signal pads while performing connection between pads in a flexible printed circuit provided in the optical device and a circuit substrate with high positional accuracy.

According to an aspect of the invention, there is provided a connection structure between an optical device and a circuit substrate. The optical device includes a flexible printed circuit including a conductive pattern to which an electrode configured to input a radio-frequency signal to the optical device is connected. In the flexible printed circuit, connection pads, which are connected to a conductor pattern on the circuit substrate, are arranged at one edge, and the connection pads include at least one ground pad, and at least two signal pads between which the ground pad is interposed from its both sides. In addition, at least one concave portion including an opening formed in the one edge is provided at a portion, at which the ground pad is formed, in the one edge of the flexible printed circuit. In the circuit substrate, the conductive pattern, to which the ground pad is connected, on a surface of the circuit substrate, is provided with a columnar member that extends from the conductor pattern to an upper side of a substrate surface of the circuit substrate and is formed from a metal. In addition, the conductor pattern and the connection pads are fixed to each other with solder in a state in which the columnar member is fitted into the concave portion, and solder, which gradually rises from the ground pattern to a lateral surface of the columnar member, is formed between the columnar member and the ground pattern that is formed in the flexible printed circuit.

According to another aspect of the invention, at least two concave portions may be provided.

According to still another aspect of the invention, the columnar member may extend to an upper side of a plate surface of the flexible printed circuit through the concave portion, and a protrusion length of the columnar member from the plate surface may be 1 mm or greater.

According to still another aspect of the invention, the columnar member may include a portion that is bent at an upper side of a substrate surface of the circuit substrate and extends along the substrate surface, a portion including the one edge of the flexible printed circuit may be disposed to be interposed between the portion that extends along the substrate surface and the substrate surface, and solder, which gradually rises from the ground pattern to the lateral surface of the columnar member, may be formed between the portion that extends along the substrate surface and the substrate surface.

According to still another aspect of the invention, the concave portion may have a semi-circular shape in a plan view, and the columnar metal may be a pin that has a circular cross-section and is inserted into a via or a through-hole that is provided in the circuit substrate.

According to still another aspect of the invention, there is provided an optical transmission apparatus. The optical transmission apparatus includes: an optical modulator that is an optical device including a flexible printed circuit; and a circuit substrate on which a circuit that drives the optical modulator is constructed. The flexible printed circuit and the circuit substrate are connected to each other with the connection structure according to any one of the aspects.

DETAILED DESCRIPTION OF THE INVENTION

Hereinafter, an embodiment of the invention will be described with reference to the accompanying drawings. Furthermore, in this embodiment, a connection structure between an optical modulator and a circuit substrate is illustrated as an example, but the connection structure of the invention is not limited thereto, and is widely applicable to connection between an arbitrary optical device (for example, an optical switch) to which a plurality of radio-frequency signals are input for an operation, and a circuit substrate.

Figure 1:
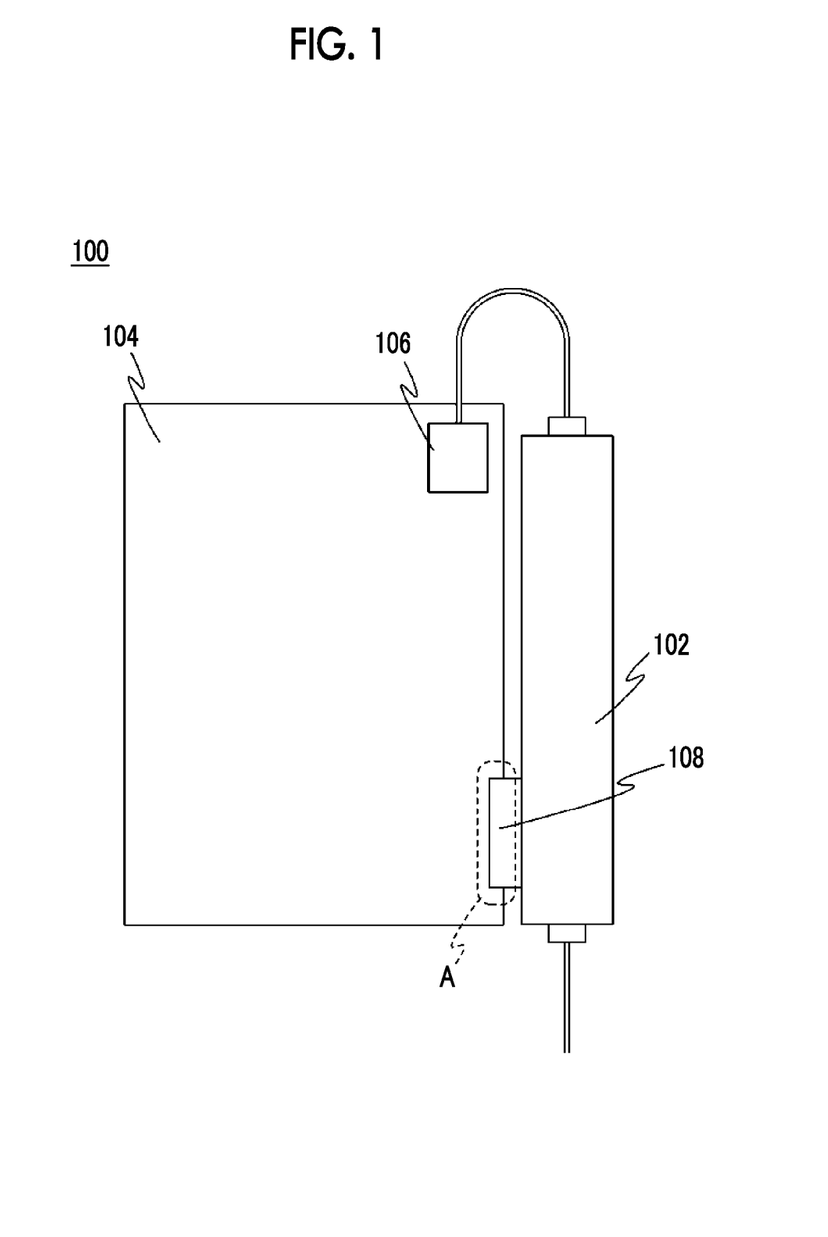
FIG. 1 is a view illustrating a configuration of an optical transmission apparatus that employs a connection structure between an optical modulator that is an optical device and a circuit substrate according to an embodiment of the invention.

FIG. 1 is a view illustrating a configuration of an optical transmission apparatus that employs the connection structure between the optical modulator and the circuit substrate according to an embodiment of the invention. An optical transmission apparatus 100 includes an optical modulator 102, a circuit substrate 104 that outputs a radio-frequency signal for driving the optical modulator 102, and a light source 106 that is mounted on the circuit substrate 104. The optical modulator 102 includes a flexible printed circuit (FPC) 108 configured to input a radio-frequency signal. As to be described later, pads provided on the FPC 108 and pads provided on the circuit substrate are soldered, and thus the radio-frequency signal output from the circuit substrate 104 is input to the optical modulator 102. In response to the radio-frequency signal, the optical modulator 102 modulates a light beam input from the light source 106, and outputs the modulated light beam. Then, the light beam that is output is input to an optical transmission path fiber (not illustrated).

Furthermore, in the following description, it is assumed that the connection structure between the optical modulator 102 and the circuit substrate 104 represents a connection structure between the FPC 108 and the circuit substrate 104 in a portion A in the drawing at which the FPC 108 of the optical modulator 102 and the circuit substrate 104 are connected to each other.

Figure 2A:
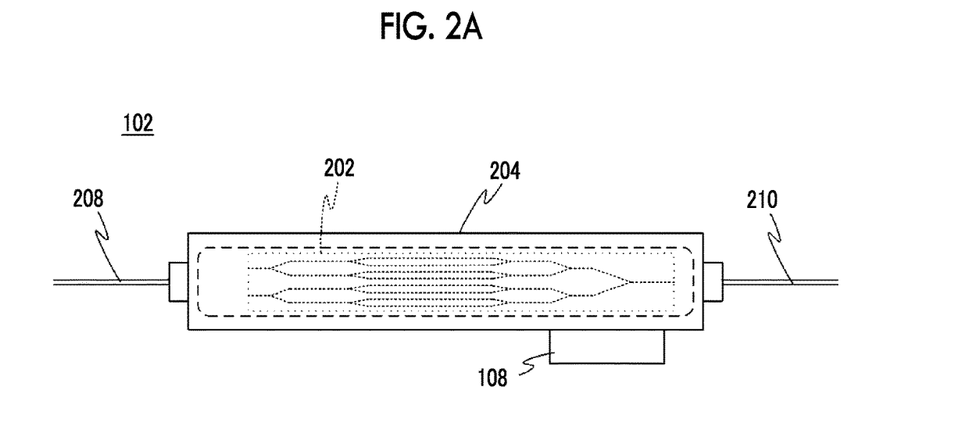
FIG. 2A is a view illustrating a configuration of the optical modulator illustrated in FIG. 1.
Figure 2B:
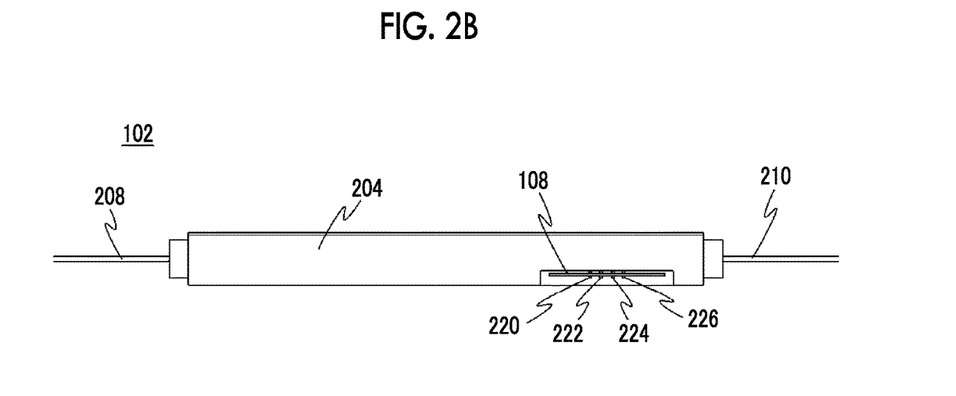
FIG. 2B is a view illustrating the configuration of the optical modulator illustrated in FIG. 1.
Figure 2C:
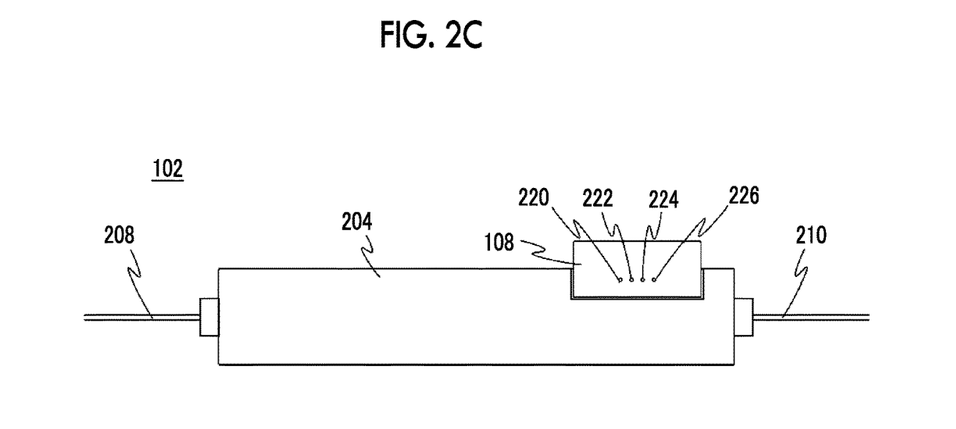
FIG. 2C is a view illustrating the configuration of the optical modulator illustrated in FIG. 1.

FIGS. 2A, 2B, and 2C are views illustrating a configuration of the optical modulator 102.

The optical modulator 102 includes an optical modulation element 202, a housing 204 that houses the optical modulation element 202, the FPC 108, an optical fiber 208 that inputs a light beam from the light source 106 to the optical modulation element 202, and an optical fiber 210 that guides the light beam output from the optical modulation element 202 to the outside of the housing 204.

For example, the optical modulation element 202 is a DP-QPSK optical modulator including four Mach-Zehnder optical waveguides provided on an LN substrate, and four radio-frequency electrodes (RF electrodes) which are respectively provided on the Mach-Zehnder optical waveguides and modulate a light wave that propagates through the inside of the optical waveguides. Two light beams output from the optical modulation element 202 are combined into one light beam, for example, by a lens optical system (not illustrated), and the resultant light beam is guided to the outside of the housing 204 through the optical fiber 210.

The housing 204 includes four lead pins 220, 222, 224, and 226 which are respectively connected to four RF electrodes (not illustrated) which are provided in the optical modulation element 202. The lead pins 220, 222, 224, and 226 provided in the housing 204 are inserted into the following through-holes 320, 322, 324, and 326 which are provided in the FPC 108, and the through-holes 320, 322, 324, and 326 and the lead pins 220, 222, 224, and 226 are connected and fixed to each other, for example, with solder.

Figure 3A:
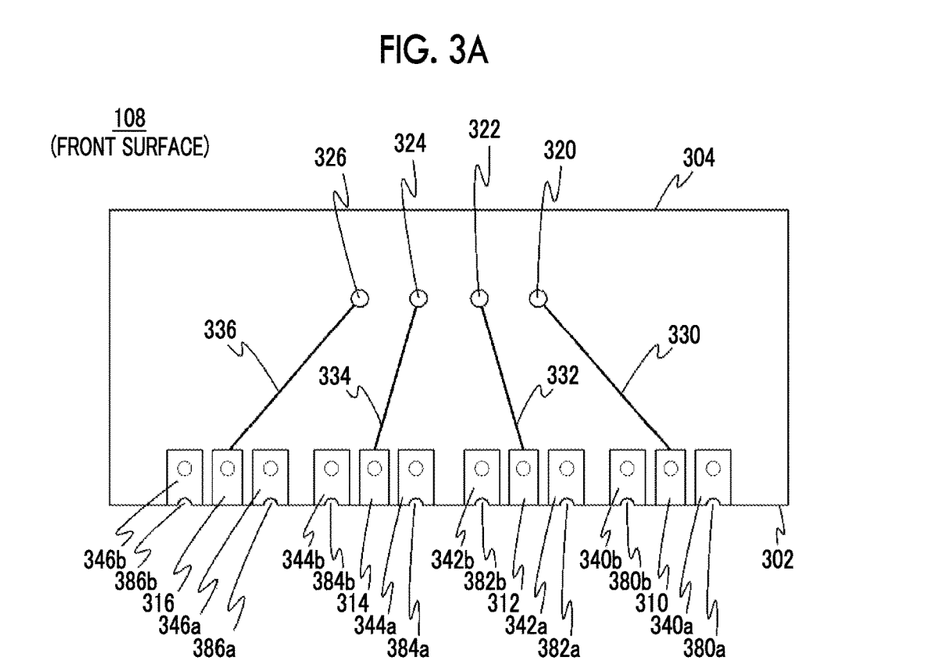
FIG. 3A is a view illustrating a configuration of a front surface of a flexible printed circuit that is provided in the optical modulator illustrated in FIGS. 2A, 2B, and 2C.
Figure 3B:
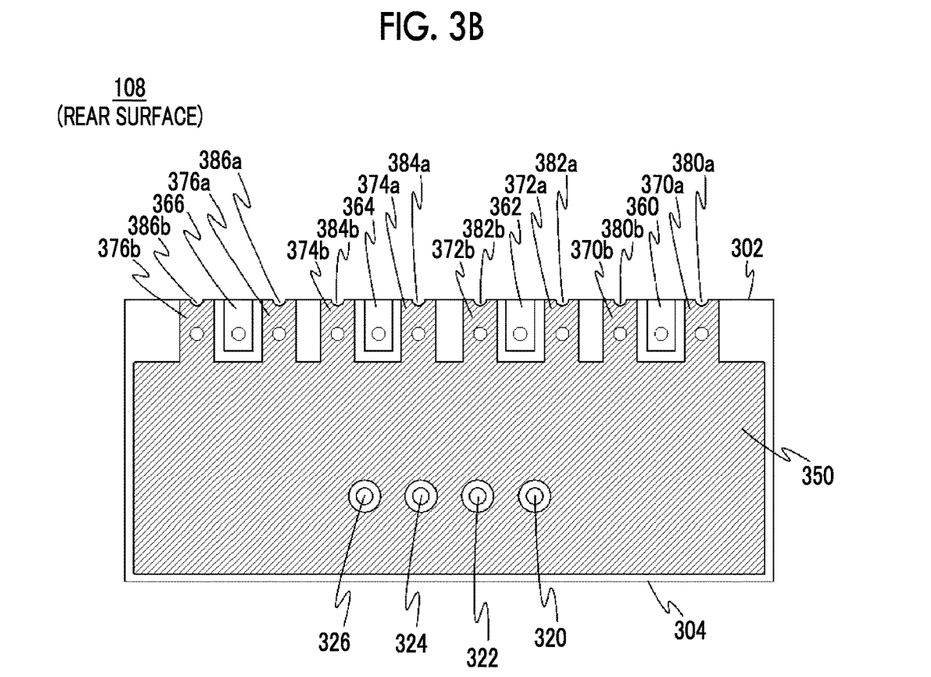
FIG. 3B is a view illustrating a configuration of a rear surface of the flexible printed circuit that is provided in the optical modulator illustrated in FIGS. 2A, 2B, and 2C.

FIGS. 3A and 3B are views illustrating a configuration of the FPC 108. Here, FIG. 3A is a view illustrating a configuration of one surface (referred to as a front surface) of the FPC 108 that is in contact with the circuit substrate 104, and FIG. 3B is a view illustrating a configuration of the other surface (referred to as a rear surface) of the FPC 108 which is opposite to the one surface.

For example, the FPC 108 is prepared by using a substrate (hereinafter, referred to as an FPC substrate) of which a main material is polyimide. For example, the FPC 108 is constituted in a rectangular shape in a plan view. However, the shape of the FPC 108 in a plan view is not limited thereto, and the FPC 108 may have an arbitrary shape.

On the front surface of the FPC 108 illustrated in FIG. 3A, four pads for signal (signal pads) 310, 312, 314, and 316 are provided in parallel in the vicinity of one side 302 on a lower side in the drawing along a direction of the one side 302. In addition, four through-holes 320, 322, 324, and 326 are provided in parallel on the other side 304 side, which is opposite to the side 302, for example, along a direction of the side 304. In addition, the four pads 310, 312, 314, and 316 are respectively connected to the through-holes 320, 322, 324, and 326 by wiring patterns 330, 332, 334, and 336.

In addition, on the front surface of the FPC 108, pads for ground (ground pads) 340*a* and 340*b*, 342*a* and 342*b*, 344*a* and 344*b*, and 346*a* and 346*b* are provided in parallel at positions at which each of the signal pads 310, 312, 314, and 316 is interposed between each pair of the ground pads from both sides along a direction of the side 302. The ground pads 340*a*, 340*b*, 342*a*, 342*b*, 344*a*, 344*b*, 346*a*, and 346*b* are respectively connected to ground patterns 370*a*, 370*b*, 372*a*, 372*b*, 374*a*, 374*b*, 376*a*, and 376*b* (to be described later) on the rear surface through via-holes.

On the other hand, a ground plane 350 is formed on the rear surface of the FPC 108 illustrated in FIG. 3B, and the wiring patterns 330, 332, 334, and 336 on the front surface constitute a grounded coplanar waveguide (GCPW) in combination with the ground plane 350 on the rear surface. In addition, the ground plane 350 extends to positions corresponding to the ground pads 340*a*, 340*b*, 342*a*, 342*b*, 344*a*, 344*b*, 346*a*, and 346*b* on the front surface, and constitutes the ground patterns 370*a*, 370*b*, 372*a*, 372*b*, 374*a*, 374*b*, 376*a*, and 376*b*.

In addition, signal pads 360, 362, 364, and 366 are provided on the rear surface of the FPC 108 at positions corresponding to the signal pads 310, 312, 314, and 316 on the front surface, for example, in the same size as that of the signal pads 310, 312, 314, and 316, and the signal pads 360, 362, 364, and 366, and the signal pads 310, 312, 314, and 316 are electrically connected to each other through via-holes.

Particularly, in this embodiment, semi-circular concave portions 380*a*, 380*b*, 382*a*, 382*b*, 384*a*, 384*b*, 386*a*, and 386*b* in a plan view, which respectively include an opening in the side 302, are formed in the side 302 of the FPC 108 at portions at which the ground pads 340*a*, 340*b*, 342*a*, 342*b*, 344*a*, 344*b*, 346*a*, and 346*b* are formed. The concave portions 380*a*, 380*b*, 382*a*, 382*b*, 384*a*, 384*b*, 386*a*, and 386*b* are respectively provided a metal film on an inner surface thereof, and the metal film connect each of the ground pads 340*a*, 340*b*, 342*a*, 342*b*, 344*a*, 344*b*, 346*a*, and 346*b* on the front surface and each of the ground patterns 370*a*, 370*b*, 372*a*, 372*b*, 374*a*, 374*b*, 376*a*, and 376*b* on the rear surface. The concave portions 380*a*, 380*b*, 382*a*, 382*b*, 384*a*, 384*b*, 386*a*, and 386*b* can be prepared, for example, by cutting out a through-hole in which a metal film is formed on an inner surface and which includes a circular opening, and by setting the resultant cut-out surface as the side 302.

Figure 4:
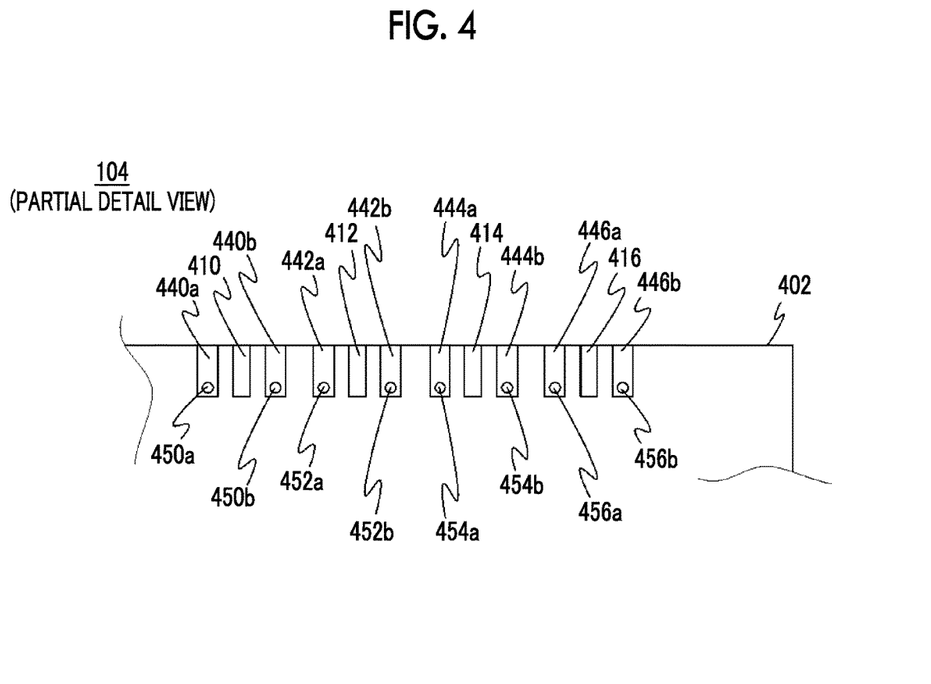
FIG. 4 is a partial detail view of the circuit substrate illustrated in FIG. 1.

FIG. 4 is a partial detail view of the circuit substrate 104, and in the drawing, a configuration of pads provided at a portion (that is, the portion A in FIG. 1), which is in contact with the FPC 108, in the circuit substrate 104. In one side 402, to which the FPC 108 of the optical modulator 102 is connected, of the circuit substrate 104, circuit signal pads 410, 412, 414, and 416, and circuit ground pads 440*a*, 440*b*, 442*a*, 442*b*, 444*a*, 444*b*, 446*a*, and 446*b*, to which the signal pads 310, 312, 314, and 316, and the ground pads 340*a*, 340*b*, 342*a*, 342*b*, 344*a*, 344*b*, 346*a*, and 346*b* on the front surface of the FPC 108 are respectively connected, are provided in parallel at positions corresponding to the signal pads 310, 312, 314, and 316, and the ground pads 340*a*, 340*b*, 342*a*, 342*b*, 344*a*, 344*b*, 346*a*, and 346*b*.

Particularly, in this embodiment, the circuit ground pads 440*a*, 440*b*, 442*a*, 442*b*, 444*a*, 444*b*, 446*a*, and 446*b*, which are conductor patterns connected to the ground pads 340*a*, 340*b*, 342*a*, 342*b*, 344*a*, 344*b*, 346*a*, and 346*b* of the FPC 108, are respectively provided with pins 450*a*, 450*b*, 452*a*, 452*b*, 454*a*, 454*b*, 456*a*, and 456*b* which are columnar members which extend from the conductor patterns to an upper side of a substrate surface of the circuit substrate 104 (in a direction to be spaced apart from the substrate surface) and have a circular cross-section.

For example, the pins 450*a*, 450*b*, 452*a*, 452*b*, 454*a*, 454*b*, 456*a*, and 456*b* can be provided by inserting metal pins into through-holes, which are respectively provided in the circuit ground pads 440*a*, 440*b*, 442*a*, 442*b*, 444*a*, 444*b*, 446*a*, and 446*b*, and by fixing the pins to the through-holes through soldering.

Figure 5A:
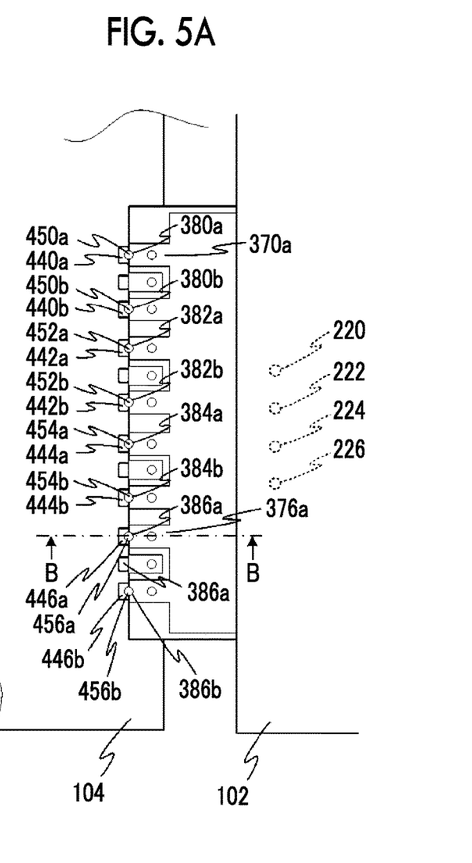
FIG. 5A is a view illustrating the connection structure between the optical modulator and the circuit substrate as illustrated in FIG. 1.
Figure 5B:
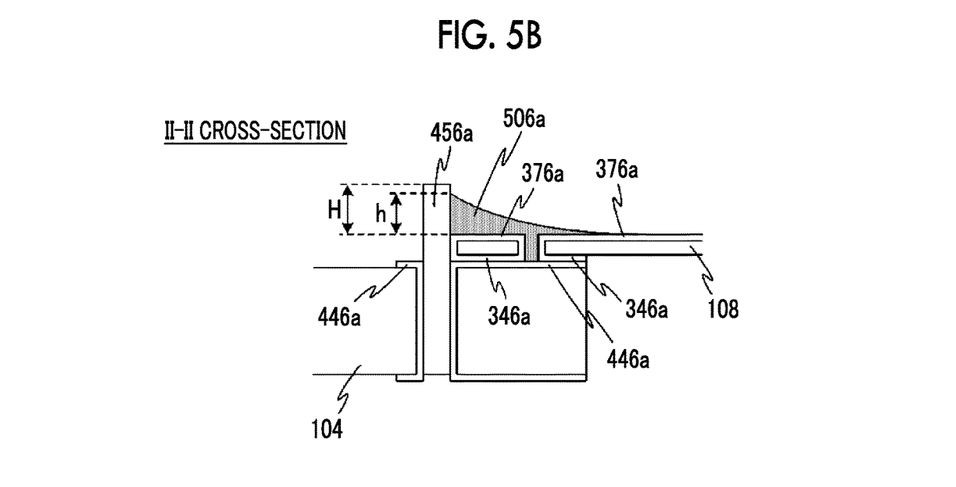
FIG. 5B is a II-II cross-sectional view of the connection structure illustrated in FIG. 5A.

FIGS. 5A and 5B are views illustrating a structure (connection structure) of a connection portion (the portion A in FIG. 1) between the optical modulator 102 (specifically, the FPC 108 provided in the optical modulator 102) and the circuit substrate 104. FIG. 5A is a view when seen from an upper surface of the optical modulator 102, and FIG. 5B is a view when seen from a II-II cross-sectional arrow direction in FIG. 5A, and illustrates a state in which the pin 456*a*, the circuit ground pad 446*a*, the ground pad 346*a*, and the ground pattern 376*a* are soldered.

In this embodiment, the FPC 108 of the optical modulator 102 is disposed on the circuit substrate 104 so that the pins 450*a*, 450*b*, 452*a*, 452*b*, 454*a*, 454*b*, 456*a*, and 456*b* provided in the circuit substrate 104 are respectively fitted into the concave portions 380*a*, 380*b*, 382*a*, 382*b*, 384*a*, 384*b*, 386*a*, and 386*b* provided in the side 302 of the FPC 108 (FIG. 5A). According to this, a relative position of the FPC 108 with respect to the circuit substrate 104 is determined with high accuracy, and thus solder-fixing is performed in a state in which relative positions of the signal pads 310, 312, 314, and 316 of the FPC 108 with respect to the circuit signal pads 410, 412, 414, and 416 of the circuit substrate 104 are determined with high accuracy. As a result, it is possible to effectively reduce reflection and a loss of a radio-frequency signal at joint portions between the circuit signal pads 410, 412, 414, and 416 of the circuit substrate 104, and the signal pads 310, 312, 314, and 316 of the FPC 108, and it is also possible to reduce a manufacturing variation of the pads.

In addition, in this embodiment, as illustrated in FIG. 5B, in a state in which the pin 456*a*, the circuit ground pad 446*a*, the ground pad 346*a*, and the ground pattern 376*a* are soldered, since the pin 456*a* exists, a solder portion 506*a* having, for example, a meniscus shape, which gradually rises from the ground pattern 376*a* to a lateral surface of the pin 456*a*, is formed. Furthermore, the configuration illustrated in FIG. 5B represents a configuration of the pin 456*a*, the circuit ground pad 446*a*, the ground pad 346*a*, and the ground pattern 376*a*, which are solder-connected, as an example. Configurations of respective connection portions between the other pins 450*a*, 450*b*, 452*a*, 452*b*, 454*a*, 454*b*, and 456*b*, the other circuit ground pads 440*a*, 440*b*, 442*a*, 442*b*, 444*a*, 444*b*, and 446*b*, the ground pads 340*a*, 340*b*, 342*a*, 342*b*, 344*a*, 344*b*, and 346*b*, and the other ground patterns 370*a*, 370*b*, 372*a*, 372*b*, 374*a*, 374*b*, and 376*b*, which are solder-connected, are the same as the configuration illustrated in FIG. 5B.

That is, a solder portion similar to the solder portion 506*a* illustrated in FIG. 5B is also formed not only between the pin 456*a* and the ground pattern 376*a*, but also between the pins 450*a*, 450*b*, 452*a*, 452*b*, 454*a*, 454*b*, and 456*b*, and the ground patterns 370*a*, 370*b*, 372*a*, 372*b*, 374*a*, 374*b*, and 376*b*. Here, solder portions, which are the same as the solder portion 506*a* and are respectively formed between the pins 450*a*, 450*b*, 452*a*, 452*b*, 454*a*, 454*b*, and 456*b*, and the ground patterns 370*a*, 370*b*, 372*a*, 372*b*, 374*a*, 374*b*, and 376*b*, are referred to as solder portions 500*a*, 500*b*, 502*a*, 502*b*, 504*a*, and 506*b*.

The solder portions 506*a* and the like function as a shield that electrically shields between respective connection portions of the circuit signal pad 416 and the like and the signal pad 316 and the like, the connection portions being adjacent to each other the ground pattern 376a and the like, on which the solder portion 506a and the like are formed, interposed therebetween. For example, the solder portion 506a that is formed between the pin 456a and the ground pattern 376a as illustrated in FIG. 5B, and the solder portion 504b that is formed between the pin 454b and the ground pattern 374b function as a shield between the connection portion of the circuit signal pad 416 and the signal pad 316, and the connection portion of the circuit signal pad 414 and the signal pad 314, the connection portions being adjacent to each other with the ground patterns 374b and 376a interposed therebetween.

According to this, in the connection structure according to this embodiment as illustrated in FIG. 5A, cross-talk between connection portions of the signal pads 310, 312, 314, and 316 of the FPC 108 and the circuit signal pads 410, 412, 414, and 416 of the circuit substrate 104 is effectively reduced.

Here, a height h (FIG. 5B) of the solder portion 506a and the like is determined by the amount of solder that is applied to the portion, and a protrusion height H of the pin 456a and the like from the FPC 108, and it is possible to adjust the reduction amount of cross-talk between connection portions of the signal pad 310 and the like and the circuit signal pad 410 and the like by adjusting the height h through adjustment of the amount of solder and the height H. For example, the protrusion height H can be set to 1 mm or greater. As an effect thereof, for example, in a case where a distance between adjacent signal electrodes is set to approximately 4 mm, and H is set to 1 mm, a reduction effect of approximately of 5 dB is obtained with respect to cross-talk between the adjacent signal electrodes at a signal frequency of approximately 20 GHz.

Furthermore, in this embodiment, it is assumed that the pin 456a and the like is a conductor having a linear circular columnar shape, but the shape of the pin 456a and the like is not limited to the shape, and may be set to an arbitrary shape as long as a solder portion that constitutes a shield is formed on an upper side of the ground pattern 376a and the like. For example, the pin 456a and the like may be bent after protruding from the circuit ground pad 446a, and an upper side of the ground pattern 376a and the like may include a portion that extends along a surface of the FPC 108.

Figure 6:
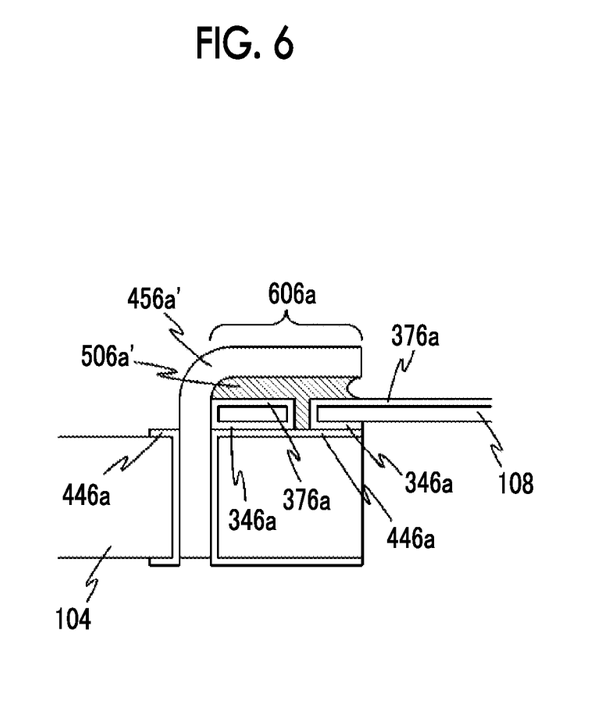
FIG. 6 is a modification example of the connection structure illustrated in FIG. 5B.

FIG. 6 is a view illustrating a modification example, which includes the above-described pin, of the above-described embodiment. FIG. 6 illustrates a configuration of a portion corresponding to the portion illustrated in FIG. 5A in this modification example. In this modification example, a pin 456a' corresponding to the pin 456a protrudes to an upper side of the circuit ground pad 446a, and is bent to a right direction in the drawing to constitute an extension portion 606a that extends in parallel to the surface of the FPC 108. In addition, a solder portion 506a' is formed between the extension portion 606a and the ground pattern 376a.

In this case, the entirety of the extension portion 606a and the solder portion 506a' function as a shield, and cross-talk between adjacent connection portions of the circuit signal pads 416 and 414, and the signal pads 316 and 314 is further effectively reduced. The other pins 450a, 450b, 452a, 452b, 454a, 454b, and 456b illustrated in FIG. 5A may have the same configuration as that of the pin 456a', and the same solder portion as that of the solder portion 506a' may be formed between the pins 450a, 450b, 452a, 452b, 454a, 454b, and 456b, and the ground patterns 370a, 370b, 372a, 372b, 374a, 374b, and 376b.

Furthermore, a position of a bent portion of the pin 456a' may be adjusted in order for the FPC 108 to be interposed between the extension portion 606a and the circuit substrate 104. According to this, when solder-connecting the circuit signal pad 410 and the like, the circuit ground pad 440a and the like, signal pad 310 and the like, and the ground pad 340a and the like, it is possible to prevent floating of the FPC 108 with respect to the circuit substrate 104, and thus the above-described configuration is preferable from the viewpoint of improving workability. In this case, the above-described cross-talk reducing effect is obtained mainly by the extension portion 606a.

As described above, in the connection structure (that is, the structure in the portion A in FIG. 1 as illustrated in FIGS. 5A and 5B) between the optical modulator 102 and the circuit substrate 104 in the optical transmission apparatus 100 according to this embodiment, the FPC 108, which is provided in the optical modulator 102, includes the signal pad 310 and the like to which a radio-frequency signal is applied and the like, and the ground pad 340a and the like which are provided at positions, at which the signal pad 310 and the like are respectively interposed from both sides, along the one side 302. In addition, the semi-circular concave portions 380a and the like, which include an opening at the side 302, are provided at an end of the ground pad 340a and the like. In addition, the circuit signal pad 410 and the like and the circuit ground pad 440a and the like, which are respectively connected to the signal pad 310 and the like and the ground pad 340a and the like, are provided in the one side 402 of the circuit substrate 104, and the pin 450a and the like, which are respectively fitted into a plurality of the concave portions 380a of the FPC 108, are provided in the circuit ground pad 440a and the like.

According to this, in the connection structure of the optical transmission apparatus 100, a relative position of the signal pad 310 and the like of the FPC 108 with respect to the circuit signal pad 410 and the like of the circuit substrate 104 is determined with high accuracy, and thus it is possible to perform connection in which reflection or a loss of a radio-frequency signal is small. In addition, for example, the solder portion 500a having a meniscus shape, which gradually rises along a lateral surface of the pin 450a, is formed between the pin 450a that is provided in the circuit ground pad 440a and the like, and the ground pattern 370a and the like on the rear surface of the FPC 108, it is possible to reduce cross-talk between connection portions of the circuit signal pad 410 and the like and the signal pad 310 and the like.

Furthermore, in this embodiment, it is assumed that the four signal pads 310, 312, 314, and 316 are provided in the FPC 108, but the number of the signal pads is not limited thereto and may be set to an arbitrary number of two or greater.

In addition, in this embodiment, it is assumed that the pin 450a and the like are provided in the entirety of the circuit ground pad 440a and the like of the circuit substrate 104, but there is no limitation thereto. At least two pins may be provided in arbitrary pads among the circuit ground pad 440a and the like as long as the at least two pins are provided to determine a relative position of the FPC 108 with respect to the circuit substrate 104.

In addition, for example, pins (for example, the pins 450a and 456b) may not be provided in the circuit ground pads (for example, the circuit ground pads 440a and 446b) which are not interposed between adjacent circuit signal pads among the circuit signal pad 410 and the like which are connected to the signal pad 310 and the like of the FPC 108.

In addition, in this embodiment, it is assumed that a piece of the pin 450*a* and the like are individually provided with respect to the circuit ground pad 440*a* and the like, but two or more pins may be provided with respect to one circuit ground pad. In this case, a signal pad, which is connected to a circuit ground pad provided with the two or more pins, may be provided with two or more concave portions into which the two or more pins are fitted.

In addition, in this embodiment, it is assumed that the concave portion 380*a* and the like has a semi-circular shape in a plan view, and the pin 450*a* and the like are circular columns having a circular cross-section. However, the shape of the concave portion 380*a* and the like in a plan view, and the cross-sectional shape of the pin 450*a* and the like are not limited thereto, and may be arbitrary shapes as long as the pin 450*a* and the like can be fitted into the concave portion 380*a* and the like. For example, the shape of the concave portion 380*a* and the like may be set to a triangular shape in a plan view, and the cross-sectional shape of the pin 450*a* and the like may be a rectangular shape of which a part is inserted in the triangular shape.

What is claimed is:

1. A connection structure between an optical device and a circuit substrate, wherein the optical device includes a flexible printed circuit including a conductive pattern to which an electrode configured to input a radio-frequency signal to the optical device is connected, in the flexible printed circuit, connection pads, which are connected to a conductor pattern on the circuit substrate, are arranged at one edge, the connection pads include at least one ground pad, and at least two signal pads between which the ground pad is interposed from its both sides, and at least one concave portion including an opening formed in the one edge is provided at a portion, at which the ground pad is formed, in the one edge of the flexible printed circuit, and in the circuit substrate, the conductor pattern, to which the ground pad is connected, on a surface of the circuit substrate, is provided with a columnar member that extends from the conductor pattern to an upper side of a substrate surface of the circuit substrate and is formed from a metal, the conductor pattern and the connection pads are fixed to each other with solder in a state in which the columnar member is fitted into the concave portion, and solder, which gradually rises from a ground pattern to a lateral surface of the columnar member, is formed between the columnar member and the ground pattern that is formed in the flexible printed circuit.

2. The connection structure according to claim 1, wherein at least two concave portions are provided.

3. The connection structure according to claim 1, wherein the columnar member extends to an upper side of a plate surface of the flexible printed circuit through the concave portion, and
a protrusion length of the columnar member from the plate surface is 1 mm or greater.

4. The connection structure according to claim 1, wherein the columnar member includes a portion that is bent at an upper side of a substrate surface of the circuit substrate and extends along the substrate surface,
a portion including the one edge of the flexible printed circuit is disposed to be interposed between the portion that extends along the substrate surface and the substrate surface, and
solder, which gradually rises from the ground pattern to the lateral surface of the columnar member, is formed between the portion that extends along the substrate surface and the substrate surface.

5. The connection structure according to claim 1, wherein the concave portion has a semi-circular shape in a plan view, and
the columnar member is a pin that has a circular cross-section and is inserted into via or a through-hole that is provided in the circuit substrate.

6. An optical transmission apparatus, comprising:
an optical modulator that is an optical device including a flexible printed circuit; and
a circuit substrate on which a circuit that drives the optical modulator is constructed,
wherein the flexible printed circuit and the circuit substrate are connected to each other with the connection structure according to claim 1.

* * * * *